US009680432B2

(12) United States Patent
Otani et al.

(10) Patent No.: US 9,680,432 B2
(45) Date of Patent: Jun. 13, 2017

(54) POWER AMPLIFIER AND INPUT SIGNAL ADJUSTING METHOD

(71) Applicant: YAMAHA CORPORATION, Hamamatsu-shi, Shizuoka (JP)

(72) Inventors: Yohei Otani, Hamamatsu (JP); Masao Noro, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 15/067,550

(22) Filed: Mar. 11, 2016

(65) Prior Publication Data

US 2016/0268986 A1    Sep. 15, 2016

(30) Foreign Application Priority Data

Mar. 13, 2015  (JP) ................................. 2015-050897
Dec. 18, 2015  (JP) ................................. 2015-247521

(51) Int. Cl.
*H03F 3/217* (2006.01)
*H03F 5/00* (2006.01)
*H03F 1/32* (2006.01)
*H04R 3/00* (2006.01)

(52) U.S. Cl.
CPC .............. *H03F 5/00* (2013.01); *H03F 1/327* (2013.01); *H03F 1/3264* (2013.01); *H03F 3/217* (2013.01); *H04R 3/00* (2013.01); *H03F 2200/549* (2013.01)

(58) Field of Classification Search
CPC ....................................................... H03F 3/217
USPC ............................................ 330/251, 207 A
See application file for complete search history.

(56) References Cited

U.S. PATENT DOCUMENTS

| 4,995,084 | A | 2/1991 | Pritchard | |
|---|---|---|---|---|
| 5,636,284 | A | 6/1997 | Pritchard | |
| 6,166,596 | A * | 12/2000 | Higashiyama | .......... H03F 3/217 330/10 |
| 7,679,435 | B2 * | 3/2010 | Tsuji | .................... H03F 3/2175 330/10 |

(Continued)

FOREIGN PATENT DOCUMENTS

WO    03/090343 A2    10/2003

OTHER PUBLICATIONS

Li et al., "Why Do Tube Amplifiers Have Fat Sound while Solid State Amplifiers Don't", AES Convention 131, Convention Paper 8536, Oct. 2011, pp. 1-12; XP040567610.

(Continued)

*Primary Examiner* — Henry Choe
(74) *Attorney, Agent, or Firm* — Rossi, Kimms & McDowell LLP

(57) ABSTRACT

A power amplifier includes a class-D amplifier and an input signal supplier. The class-D amplifier includes an input portion and a switching device. The switching device is switched according to an input signal that is input to the input portion so that a current is supplied to a load from a power source via the switching device. The input signal supplier supplies the input signal to the input portion of the class-D amplifier, calculates a virtual output voltage to be output from a virtual power source having a prescribed internal impedance characteristic when a current to flow through the load is output from the virtual power source, and adjust an amplitude of the input signal according to the virtual output voltage.

12 Claims, 5 Drawing Sheets

(56) References Cited

U.S. PATENT DOCUMENTS

| | | | |
|---|---|---|---|
| 8,502,602 B2 * | 8/2013 | Hirano | H03F 3/217 330/10 |
| 8,908,886 B2 * | 12/2014 | Yamauchi | H03F 1/523 330/251 |
| 2005/0162228 A1 | 7/2005 | Putzeys | |
| 2014/0112486 A1 | 4/2014 | Li | |
| 2014/0355790 A1 * | 12/2014 | Panov | H03F 3/217 381/120 |

OTHER PUBLICATIONS

Extended European Search Report issued in European Application No. EP16159826.3 mailed Jul. 7, 2016.

* cited by examiner

US 9,680,432 B2

POWER AMPLIFIER AND INPUT SIGNAL ADJUSTING METHOD

CROSS REFERENCE TO RELATED APPLICATIONS

This application is based on Japanese Patent Application (No. P2015-050897) filed on Mar. 13, 2015 and Japanese Patent Application (No. P2015-247521) filed on Dec. 18, 2015, the contents of which are incorporated herein by reference.

BACKGROUND OF THE INVENTION

1. Field of the Invention

The present disclosure relates to a power amplifier and, more particularly, to a power amplifier that is suitable for use as a guitar amplifier, and an input signal adjusting method.

2. Description of the Related Art

In recent years, power amplifiers using semiconductor devices such as class-D amplifiers have come into wide use as audio power amplifiers. For example, in class-D amplifiers, an output-stage transistor is on/off-switched by a PWM pulse sequence that is generated through pulse width modulation according to an input audio signal and a current is supplied to a speaker from a power source via the output-stage transistor. Class-D amplifiers can supply power to speakers efficiently because they are very low in output impedance and are hence very low in the loss of the output-stage transistor. More specifically, whereas the internal impedance of speakers is 8 to 16Ω, the output impedance of class-D amplifiers is approximately equal to 0Ω.

Furthermore, in class-D amplifiers, usually a voltage that is input to a speaker is fed back to an input portion and the gain of the class-D amplifier is controlled according to the difference between the input audio signal and the negative feedback signal. Therefore, class-D amplifiers can perform constant-voltage driving in which a voltage corresponding to an input audio signal is supplied to a speaker independently of the frequency. An exemplary document among related art documents relating to class-D amplifiers is WO2003/090343.

Even at the present time when power amplifiers using semiconductor devices are in common use, vacuum tube amplifiers are still used frequently as guitar amplifiers that amplify an output signal of an electric guitar. This is because vacuum tube amplifiers allow speakers to emit, at high volume levels, sound with quality preferred by players, which is in contrast to power amplifiers using semiconductor devices.

A factor that has great influence on the quality of reproduction sound in the case where vacuum tube amplifiers are used is characteristics of power sources that are use for vacuum tube amplifiers. More specifically, for vacuum tube amplifiers, power amplifiers having an internal capacitor and a relatively large internal impedance are used. As a result, vacuum tube amplifiers can provide a large instantaneous maximum power relative to a continuous-wave maximum power and make it possible to emit sound at high volume levels instantaneously. Thus, vacuum tube amplifiers realize reproduction sound having unique quality by virtue of their constant-current output characteristic and the above characteristics of a power source.

However, vacuum tube amplifiers are inconvenient to handle because they are large in size and heavy. Vacuum tube amplifiers employ, in an output stage, a pentode that is high in output impedance and hence suffer a large loss in the output stage, which raises another problem that they cannot drive loads (speakers) efficiently.

Therefore, to drive loads efficiently, it is necessary to use class-D amplifiers. In this case, to allow class-D amplifiers to perform sound reproduction of the same level as vacuum tube amplifiers do, a method is conceivable that employs, for class-D amplifiers, the same power sources as used for vacuum tube amplifiers. However, power sources for vacuum tube amplifiers have large internal impedance values than ones for class-D amplifiers. Where such a power source having a high internal impedance is used for a class-D amplifier, a problem arises that it is difficult for the class-D amplifier to perform constant-voltage driving and hence it cannot exercise its function properly.

SUMMARY OF THE INVENTION

The present disclosure has been made in the above circumstances, and an object of the disclosure is therefore to provide a power amplifier and an input signal adjusting method that enable sound reproduction of the same level as obtained with an amplifier other than a class-D amplifier (e.g., vacuum tube amplifier) that uses a different power source than the class-D amplifier usually does, without impairing the function of the class-D amplifier.

The disclosure provides a power amplifier comprising:

a class-D amplifier that comprises an input portion and a switching device, wherein the switching device is switched in accordance with an input signal that is input to the input portion so that a current is supplied to a load from a power source via the switching device; and an input signal supplier configured to supply the input signal to the input portion of the class-D amplifier, to calculate a virtual output voltage to be output from a virtual power source having a prescribed internal impedance characteristic when a current to flow through the load is output from the virtual power source, and to adjust an amplitude of the input signal in accordance with the virtual output voltage.

In the disclosure, the amplitude of the input signal to the input portion of the class-D amplifier is adjusted in accordance with the virtual output voltage of the virtual power source that occurs when a current to flow through the load is output from the virtual power source, whereby the current to be supplied to the load from the class-D amplifier is adjusted. This enables sound reproduction as obtained by an amplifier using any of various kinds of virtual power sources without impairing the function of the class-D amplifier.

DETAILED DESCRIPTION OF THE EXEMPLARY EMBODIMENTS

Figure 1:
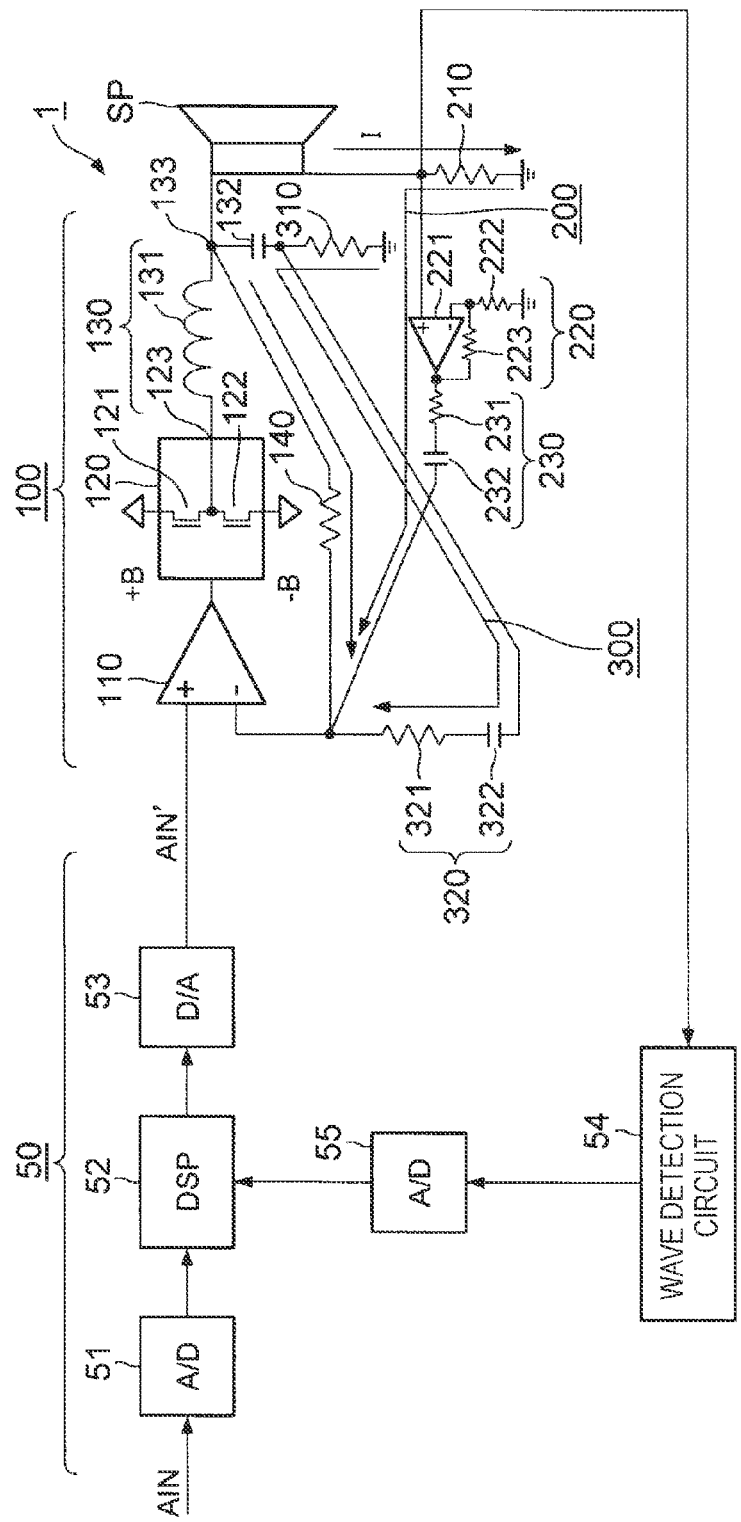
FIG. 1 is a circuit diagram showing the configuration of a power amplifier according to an embodiment of the present disclosure.

An embodiment of the present disclosure will be hereinafter described with reference to the drawings. FIG. 1 is a circuit diagram showing the configuration of a power amplifier according to the embodiment of the disclosure. To facilitate understanding of the power amplifier 1, a speaker SP which is a load of the power amplifier 1 is also illustrated in FIG. 1.

As illustrated in FIG. 1, the power amplifier 1 includes an input signal supplier 50, a class-D amplifier 100, a load current feedback circuit 200, and a filter current feedback circuit 300.

The input signal supplier 50 is a circuit for performing amplitude adjustment on an audio signal AIN that is input to the power amplifier 1 and thereby supplying an input signal AIN' to the class-D amplifier 100. The power amplifier 1 according to the embodiment may be used as an electric guitar amplifier, in which case an output signal of the electric guitar is supplied to the input signal supplier 50 as the audio signal AIN. The details of the input signal supplier 50 will be described later.

The class-D amplifier 100 includes an operational amplifier (or a comparator) 110, an output stage 120, a filter 130, and a feedback resistor 140.

The operational amplifier 110 is a circuit that serves as an input portion to which an input signal for the class-D amplifier 100 is input. The input signal AIN' is input to a non-inverting input terminal of the operational amplifier 110 from the input signal supplier 50.

The output stage 120 includes, as switching devices, a transistor 121 which is provided between a positive power source +B and an output terminal 123 of the output stage 120 and a transistor 122 which is provided between a negative power source -B and the output terminal 123 of the output stage 120. For example, the transistors 121 and 122 are MOSFETs (metal-oxide-semiconductor field-effect transistors). In the output stage 120, according to an output signal of the operational amplifier 110, the positive power source +B is connected to the output terminal 123 by turning on the transistor 121 and turning off the transistor 122 or the negative power source -B is connected to the output terminal 123 by turning off the transistor 121 and turning on the transistor 122. Therefore, an output signal of the output stage 120 has a rectangular waveform.

The filter 130 is a lowpass filter that eliminates high-frequency components that are in a frequency range higher than an audio band from the output signal of the output stage 120 and supplies a remaining audio band frequency component to the speaker SP. The filter 130 includes an inductor 131 and a capacitor 132. The inductor 131 is provided between the output terminal 123 of the output stage 120 and one terminal (node 133) of the speaker SP. One end of the capacitor 132 is connected to the node 133 between the inductor 131 and the speaker SP and the other end is grounded via a current detection resistor 310 of the filter current feedback circuit 300. That is, the capacitor 132 is connected in parallel to the speaker SP which is a load.

The feedback resistor 140 is provided between the node 133 between the inductor 131 and the speaker SP and an inverting input terminal of the operational amplifier 110. The feedback resistor 140 is a part of a self-oscillation feedback loop that feeds back an output voltage for the speaker SP to the operational amplifier 110 (which is the input portion of the class-D amplifier 100) and thereby causing self-oscillation of the class-D amplifier 100. Oscillating at a prescribed self-oscillation frequency, the class-D amplifier 100 outputs a PWM pulse sequence from the output stage 120 through pulse width modulation on the basis of the input signal AIN'. The filter 130 serves to eliminate high-frequency components that are in a frequency range higher than the self-oscillation frequency from the PWM pulse sequence and supply a resulting signal to the speaker SP. The description of the configuration of the class-D amplifier 100 completes here.

The load current feedback circuit 200 is a circuit for negatively feeding back a load current flowing through the speaker SP (which is a load of the class-D amplifier 100) to the operational amplifier 110 which is the input portion of the class-D amplifier 100. The load current feedback circuit 200 includes a current detection resistor 210, an amplification portion 220, and a coupling portion 230.

The current detection resistor 210 is provided between a terminal, opposite to the node 133, of the speaker SP and the ground line. The amplification portion 220 has an operational amplifier 221 and resistors 222 and 223. An inverting input terminal of the operational amplifier 221 is grounded via a resistor 222 and connected to an output terminal of the operational amplifier 221 via a resistor 223. A voltage across the current detection resistor 210 is applied to a non-inverting terminal of the operational amplifier 221. Therefore, the amplification portion 220 amplifies the voltage across the current detection resistor 210 at a gain (Ra+Rb)/Ra where Ra and Rb are resistances of the resistors 222 and 223, respectively, and outputs a resulting signal. In the embodiment, since in this manner the voltage across the current detection resistor 210 is amplified to a sufficiently high voltage by the amplification portion 220, the resistance of the current detection resistor 210 can be made small.

The coupling portion 230 is a series connection of a resistor 231 and a capacitor 232 which are provided between the output terminal of the amplification portion 220 and the inverting terminal of the operational amplifier 110. The coupling portion 230 serves to adjust the frequency characteristic of the feedback amount of the negative feedback by the load current feedback circuit 200.

The filter current feedback circuit 300 is a circuit for negatively feeding back a current flowing through the capacitor 132 of the filter 130 to the operational amplifier 110 which is the input portion of the class-D amplifier 100. The filter current feedback circuit 300 includes the current detection resistor 310 and a coupling portion 320. The coupling portion 320 is a series connection of a resistor 321 and a capacitor 322 which are provided between the inverting terminal of the operational amplifier 110 and the connection node between the current detection resistor 310 and the capacitor 132. The coupling portion 320 serves to adjust the frequency characteristic of the feedback amount of the negative feedback by the filter current feedback circuit 300.

Next, the input signal supplier 50 will be described. The input signal supplier 50 is a circuit for determining a virtual output voltage that is an output voltage of a prescribed virtual power source that occurs when a current to flow through the speaker SP (load) is output from the virtual power source, and adjusting the amplitude of an input signal AlN' to the input portion of the class-D amplifier 100 according to the determined virtual output voltage. The prescribed virtual power source used in the embodiment is a power source having a prescribed internal impedance characteristic; in the embodiment, the virtual power source is assumed to be a power source that is intended for a vacuum tube amplifier and has a high internal impedance.

The reason why the input signal supplier 50 is provided upstream of the class-D amplifier 100 is as follows. In general, in vacuum tube amplifiers, power sources having larger internal impedance values than ones for class-D amplifiers are used. In sound reproduction using a vacuum tube amplifier, a load current flowing through a speaker from a power source via the vacuum tube amplifier varies to a large extent according to a variation of the impedance of the speaker. As a result, the load current causes, inside the power source, a large voltage drop which serves as one factor in determining unique quality of reproduction sound of the speaker.

One method for realizing sound reproduction of the same level of quality as obtained with a vacuum tube amplifier would be use, as a power source of the output stage 120 of the class-D amplifier 100, a power source itself having a high internal impedance as used for a vacuum tube amplifier.

However, to realize an amplification operation that responds transiently at high speed to an audio signal that varies rapidly, it is necessary to use a power source having a low internal impedance. Having a high internal impedance, the power source as used for a vacuum tube amplifier cannot realize power amplification that provides such a superior transient response.

In view of the above, in the embodiment, the power sources +B and −B having small internal impedance values as used for ordinary class-D amplifiers are used as power sources of the output stage 120 of the class-D amplifier 100, and the input signal supplier 50 is provided upstream of the class-D amplifier 100 to compensate for the use of the power sources +B and −B.

The input signal supplier 50 determines a virtual output voltage that is an output voltage of a virtual power source (in the embodiment, a power source for a vacuum tube amplifier) that occurs when a load current to flow through the speaker SP is output from the virtual power source, and adjusts the amplitude of an input signal AlN' according to the determined virtual output voltage. For example, assume that the transistor 121 has been turned on and a load current I has flown through the speaker SP from the power source +B via the transistor 121. And also assume that when the load current I has been output from a virtual power source, the virtual output voltage of the virtual power source has changed from +B to +αB (0<α<1) because of a voltage drop across the internal impedance of the virtual power source.

Under these assumptions, the input signal supplier 50 adjusts the amplitude of an audio signal AlN that is input to the power amplifier 1 by multiplying it by α and supplies a resulting amplitude-adjusted signal AlN'=αAlN to the class-D amplifier 100. Adjusting the amplitude of an input signal in this manner makes it possible to realize sound reproduction of the same level of quality as obtained with a vacuum tube amplifier.

As illustrated in FIG. 1, the input signal supplier 50 includes an A/D converter 51, a DSP 52, a D/A converter 53, a wave detection circuit 54, and an A/D converter 55. The wave detection circuit 54 full-wave-rectifies an AC voltage across the current detection resistor 210 and smoothes it out on the time axis, and outputs an analog signal that represents an amplitude envelope waveform of an AC current flowing through the current detection resistor 210. The A/D converter 51, D/A converter 53, A/D converter 55, and DSP 52 operate in synchronism with a common sampling clock ϕ.

Even more specifically, the A/D converter 55 converts the analog signal that is output from the wave detection circuit 54 into a digital signal by sampling it according to the sampling clock ϕ and outputs the resulting digital signal. The A/D converter 51 converts an audio signal AlN that is input to the power amplifier 1 into a digital signal by sampling it according to the sampling clock ϕ and outputs the resulting digital signal. The DSP 52 performs digital processing in synchronism with a common sampling clock ϕ using the output signals of the A/D converters 51 and 55 and outputs a resulting digital signal. The D/A converter 53 holds the output signal of the DSP 52 in synchronism with a common sampling clock ϕ and converts it into an input signal AlN' which is an analog signal, and outputs the resulting input signal AlN' to the class-D amplifier 100.

The digital signal processing that is performed by the DSP 52 will be described below. The DSP 52 calculates a coefficient α (described later) by simulating an operation of an equivalent circuit of a virtual power source 56 illustrated in FIG. 2 and multiplies the output signal of the A/D converter 51 by the coefficient α, and outputs a resulting signal. To facilitate understanding of the details of the processing performed by the DSP 52, not only the virtual power source 56 but also the output stage 120 is illustrated in FIG. 2.

Figure 2:
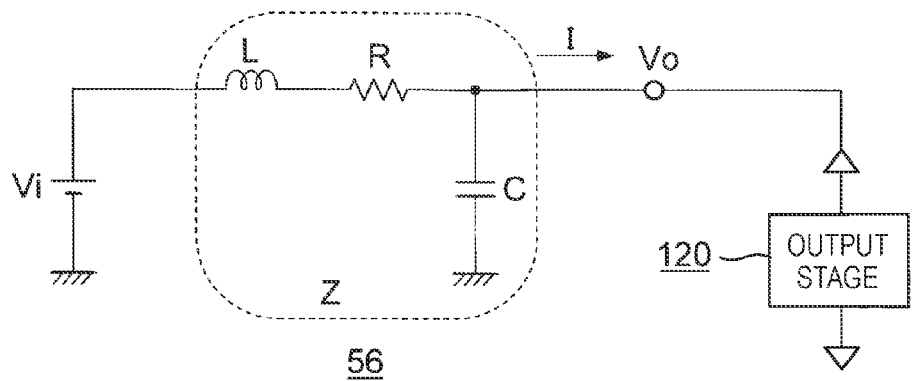
FIG. 2 is a circuit diagram showing the configuration of an equivalent circuit of a virtual power source used in the embodiment.

As illustrated in FIG. 2, the virtual power source 56 includes an internal DC voltage source Vi, an internal inductor L, an internal resistor R, and an internal capacitor C. The negative pole of the internal DC voltage source Vi is grounded. The positive pole of the internal DC voltage source Vi is connected to the high-potential power source terminal (i.e., the power source terminal to which the power source +B is connected) of the output stage 120 via the series connection of the internal inductor L and the internal resistor R. The internal capacitor C is connected between the high-potential power source terminal of the output stage 120 and the ground line. In power sources for vacuum tube amplifiers, the inductance of the internal inductor L is about several tens of henries, the resistance of the internal resistor R is about several hundreds of ohms, and the capacitance of the internal capacitor C is about several tens of microfarads. These values depend on the type of a vacuum tube amplifier.

With the virtual power source 56 having the above configuration, its virtual output voltage Vo is given by the following Equation (1):

$$Vo = Vi - IZ. \qquad (1)$$

where Z is the resultant impedance of the internal inductance L, internal resistance R, and internal capacitance C and I represents the load current that is indicated by the output signal of the A/D converter 55.

In Equation (1), the impedance Z and the load current I depend on the frequency f. Therefore, the virtual output voltage Vo of the virtual power source 56 also depends on the frequency f and hence is written as Vo(f).

The DSP 52 determines a frequency characteristic I(f) of the load current I on the basis of a sequence of samples of a load current I that was received in a past prescribed period, and calculates a frequency characteristic Vo(f) of the virtual output voltage Vo of the virtual power source 56 on the basis of the determined frequency characteristic I(f) of the load current I and a frequency characteristic Z(f) of the impedance Z according to the above Equation (1). Then the DSP 52 calculates a coefficient α(f)=Vo(f)/B by dividing the frequency characteristic Vo(f) of the virtual output voltage Vo of the virtual power source 56 by the power source voltage +B of the output stage 120.

Figure 3:
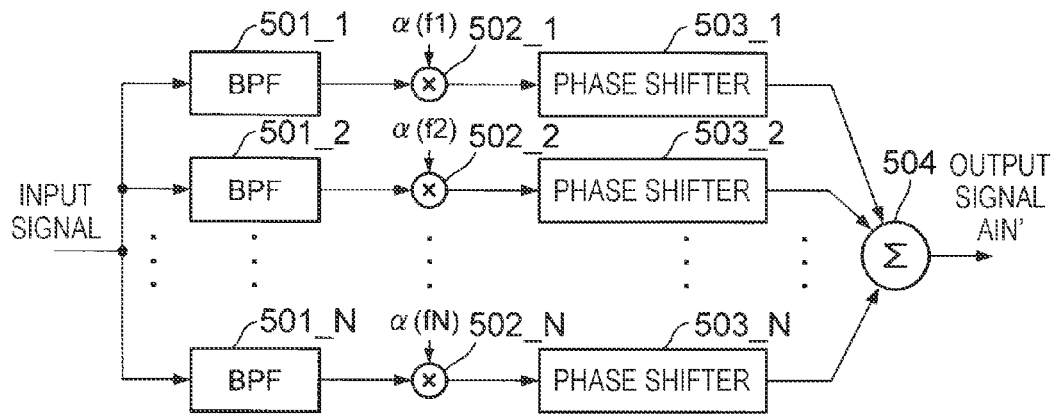
FIG. 3 is a block diagram showing the details of the signal processing that is performed by a DSP of an input signal supplier used in the embodiment.

Subsequently, the DSP 52 performs signal processing on the output signal of the A/D converter 51 using the coefficient α(f). FIG. 3 is a block diagram showing the details of the signal processing that uses the coefficient α(f). As illustrated in FIG. 3, the signal processing that uses the coefficient α(f) is performed by N BPFs 501_$k$ ($k$=1 to N), N multipliers 502_$k$ ($k$=1 to N), and N phase shifters 503_$k$ ($k$=1 to N), and an adder 504.

In the embodiment, as for the coefficient α(f) which is a function that is continuous for the frequency f, coefficients α(fk) ($k$=1 to N) are calculated for N representative frequencies fk ($k$=1 to N) selected from the audible frequency range and used for the signal processing. The center frequencies of pass bands of the BPFs 501_$k$ ($k$=1 to N) illustrated in FIG. 3 are set at fk ($k$=1 to N), respectively. The BPFs 501_$k$ ($k$=1 to N) select signals in their respective pass bands from the output signal of the A/D converter 51 and output the selected signals.

The multipliers 502_$k$ ($k$=1 to N) and the phase shifters 503_$k$ ($k$=1 to N) constitute means for multiplying the output signals of the BPFs 501_$k$ ($k$=1 to N) by the coefficients α(fk) ($k$=1 to N), respectively. Even more specifically, the coefficients α(fk) are complex numbers and are given by the following Equation (2):

$$\alpha(fk)=a(fk)\cdot\exp(j\theta(fk)). \qquad (2)$$

The multipliers 502_$k$ ($k$=1 to N) multiply the output signals of the BPFs 501_$k$ ($k$=1 to N) by the absolute values a(fk) of the coefficients α(fk) ($k$=1 to N), respectively, and output multiplication results. The phase shifters 503_$k$ ($k$=1 to N) give phase shifts corresponding to the arguments θ(fk) ($k$=1 to N) to the output signals of the multipliers 502_$k$ ($k$=1 to N), respectively, and output resulting signals. The adder 504 adds together the output signals of the phase shifters 503_$k$ ($k$=1 to N) and output a resulting signal. The output signal of the adder 504 is D/A-converted by the D/A-converter 53, and a resulting analog signal is input to the class-D amplifier 100 as an input signal AIN'. The description of the configuration of the power amplifier 1 according to the embodiment completes here.

Next, a description will be made of how the power amplifier 1 according to the embodiment operates. In the class-D amplifier 100, an output signal of the output stage 120 is given a phase rotation when it goes through the filter 130 and the feedback resistor 140, and is thus fed back to the operational amplifier 110 (input portion). As a result, the class-D amplifier 100 self-oscillates. The class-D amplifier 100 is designed so that its self-oscillation frequency is sufficiently higher than the frequency range of the input signal AIN'.

Whereas output signal of the output stage 120 is a rectangular wave, the signal waveform at the node 133 is triangular because the rectangular wave is subjected to first-order integration in the filter 130 (capacitor 132). The operational amplifier 110 compares the input signal AIN' with the triangular wave that is fed back from the node 133 via the feedback resistor 140. As a result, a PWM pulse sequence that is generated through pulse width modulation according to an input audio signal is output from the operational amplifier 110, and then input to the filter 130 via the output stage 120. High-frequency components are eliminated from the PWM pulse sequence by the filter 130, and a resulting signal is supplied to the speaker SP.

More specifically, when the voltage of the input signal AIN' is equal to 0 V, the output stage 120 outputs a PWM pulse sequence having a duty ratio 50% and the speaker SP receives a voltage 0 V. As the voltage of the input signal AIN' varies in the positive direction from 0 V, the duty ratio of the PWM pulse sequence that is output from the output stage 120 varies from 50% to 100% (in the maximum case) and the voltage applied to the speaker SP varies from 0 V to +B (in the maximum case). On the other hand, as the voltage of the input signal AIN' varies in the negative direction from 0 V, the duty ratio of the PWM pulse sequence that is output from the output stage 120 varies from 50% to 0% (in the minimum case) and the voltage applied to the speaker SP varies from 0 V to −B (in the minimum case). In this manner, a signal that approximates the input signal AIN' in waveform is applied to the speaker SP.

While the class-D amplifier 100 performs an amplifying operation in the above manner, the load current feedback circuit 200 negatively feeds back a load current I flowing through the speaker SP to the operational amplifier 110 which is the input portion of the class-D amplifier 100 and the filter current feedback circuit 300 negatively feeds back a current flowing through the filter 130 to the same operational amplifier 110. As a result of these negative feedback controls, the load current flowing through the speaker SP is kept constant irrespective of the drive frequency of the speaker SP.

Furthermore, while class-D amplifier 100 performs the amplifying operation, the input signal supplier 50 adjusts the amplitude of an input signal AIN' to be supplied to the class-D amplifier 100 according to the load current I flowing through the speaker SP. Even more specifically, the DSP 52 of the input signal supplier 50 determines a virtual output voltage Vo that is an output voltage of the virtual power source (in the embodiment, a power source for a vacuum tube amplifier) that occurs when the load current I is output from the virtual power source. And the DSP 52 supplies an input signal AIN'=αAIN whose amplitude has been adjusted using a coefficient a that is determined by the virtual output voltage Vo.

By adjusting the amplitude of the input signal AIN', the pulse width of pulses for turning on the switching device of the output stage 120 of the class-D amplifier 100 is adjusted and the load current I that is output from the class-D amplifier 100 to the speaker SP is thereby adjusted. As a result of these adjustments, sound reproduction of the same level as in the case where the speaker SP is driven by a vacuum tube amplifier.

Figure 4:
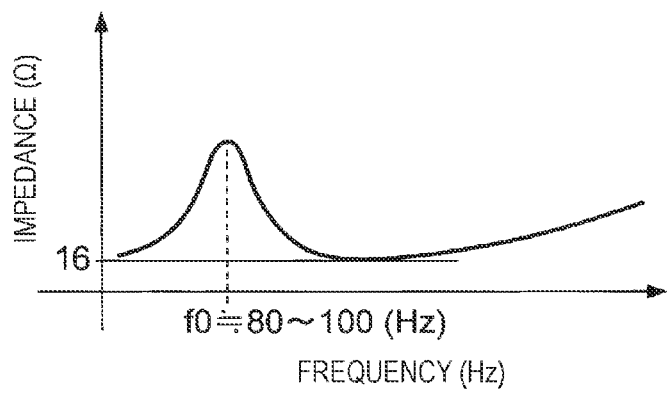
FIG. 4 shows an example frequency characteristic of the impedance of a full-range speaker.

Next, advantages of the embodiment will be described. FIG. 4 shows an example frequency characteristic of the impedance of a full-range speaker. In general, full-range speakers have a resonance frequency f0 around 80 to 100 Hz and their impedance becomes high at the resonance frequency f0. A frequency range around the resonance frequency f0 is an important range that determines the sound quality of electric guitars because this frequency range corresponds to a pitch range of sounds to be generated by the fifth and sixth chords of electric guitars.

Figure 5A:
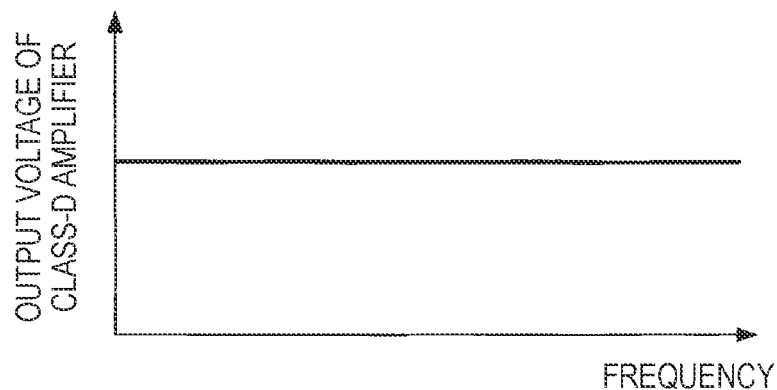
FIGS. 5A and 5B show frequency characteristics of the output voltage of a class-D amplifier and a vacuum tube amplifier, respectively.

Power amplifiers with negative feedback of an output voltage (e.g., general class-D amplifiers), that is, power amplifiers that perform constant-voltage driving on a speaker, drive a speaker using a voltage corresponding to an input audio signal without being affected by the frequency characteristic of the impedance of the speaker. Therefore, as illustrated in FIG. 5A, the speaker is driven at a constant voltage even in a frequency range around the resonance frequency f0 where its impedance is high. As a result, the vibration amplitude of the speaker and hence the amplitude of sound that is emitted from the speaker is kept constant.

Figure 5B:
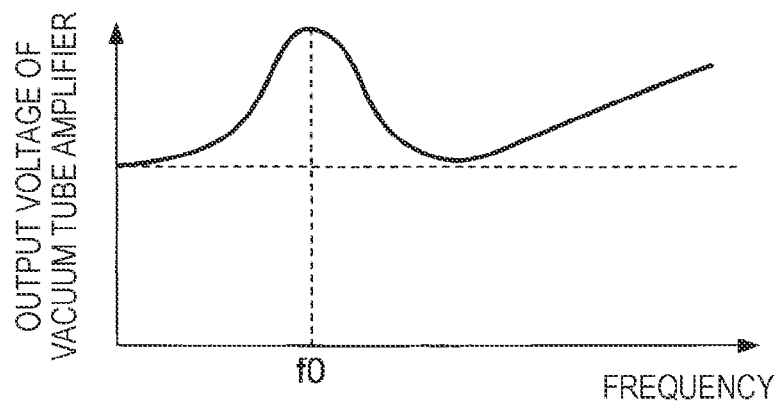

On the other hand, in general, vacuum tube amplifiers as output amplification devices use pentodes, which are high in output impedance. A vacuum tube amplifier using a pentode drives a speaker at a constant current corresponding to an input signal that is supplied to a grid of the vacuum tube irrespective of an impedance variation of the speaker. Therefore, as illustrated in FIG. 5B, in a frequency range around the resonance frequency f0 where the impedance of the speaker is high, the voltage at which the speaker is driven by the vacuum tube amplifier increases. The vibration amplitude of the speaker and hence the amplitude of sound that is emitted from the speaker is increased.

As a result, sounds generated by the fifth and sixth chords of an electric guitar are made unique, powerful ones and this feature is appreciated firmly by players. For example, when a speaker is driven by a vacuum tube amplifier whose maximum output power is 100 W, the speaker is given a peak voltage that is close to 90 V in a frequency range around the resonance frequency f0 and hence can emit a powerful, large-volume sound.

To supply a sufficiently large load current to a speaker in a frequency range around the resonance frequency f0 in a case that the speaker is driven by, for example, a general class-D amplifier, the class-D amplifier needs to be high in the power source voltage of the output stage and thus be able to provide a large output power. However, where a speaker is driven by such a high-power class-D amplifier, even in frequency ranges where the impedance of the speaker is low, constant-voltage driving is performed and an excessive current may flow through the speaker, possibly resulting in destruction of the speaker.

In contrast, in the embodiment, while the class-D amplifier 100 performs an amplifying operation, the load current feedback circuit 200 negatively feeds back a load current flowing through the speaker SP to the operational amplifier 110 which is the input portion of the class-D amplifier 100 and the filter current feedback circuit 300 negatively feeds back a current flowing through the filter 130 to the same operational amplifier 110. If the drive frequency of the speaker SP varies so as to increase the impedance of the speaker SP and thereby decrease the load current flowing through it, the feedback signal that is supplied to the input portion of the class-D amplifier 100 via the load current feedback circuit 200 decreases to increase the output signal of the class-D amplifier 100. As a result, the effective voltage that is supplied from the class-D amplifier 100 to the speaker SP increases to increase the load current flowing through it.

On the other hand, if the drive frequency of the speaker SP varies so as to decrease the impedance of the speaker SP and thereby increase the load current flowing through it, the feedback signal that is supplied to the input portion of the class-D amplifier 100 via the load current feedback circuit 200 increases to decrease the output signal of the class-D amplifier 100. As a result, the effective voltage that is supplied from the class-D amplifier 100 to the speaker SP decreases to decrease the load current flowing through it. As a result of this negative feedback control, the load current flowing through the speaker SP is kept constant irrespective of its drive frequency.

As described above, in the embodiment, by negatively feeding back the load current flowing through the speaker SP to the input portion of the class-D amplifier 100, the output impedance of the class-D amplifier 100 can be increased or decreased effectively and the load current that originates from the class-D amplifier 100 and flows through the speaker SP can be kept constant. This makes it possible to realize emission of a large-volume sound by allowing a sufficiently large load current to flow through the speaker SP in a frequency range of 80 to 100 Hz around the resonance frequency f0 where the impedance of the speaker SP increases.

Furthermore, in the embodiment, since the controls for keeping the load current flowing through the speaker SP constant irrespective of the drive frequency of the speaker SP are performed, a flow of an excessive current through the speaker SP is prevented in frequency ranges other than the frequency range of 80 to 100 Hz around the resonance frequency f0 and destruction of the speaker SP can thereby be prevented. In this manner, the power amplifier 1 according to the embodiment which uses semiconductor devices can realize high-quality, large-volume sound reproduction that can be realized conventionally only by vacuum tube amplifiers.

The embodiment also provides an advantage that reduction of the self-oscillation frequency of the class-D amplifier 100 can be prevented, which will be described below in detail. In self-oscillation amplifiers such as the class-D amplifier 100, it is necessary to set the self-oscillation frequency at a frequency (e.g., 200 to 500 kHz) that is higher than the audio band (lower than 20 kHz) by adjusting the open loop gain characteristic and the phase characteristic.

However, in the embodiment, the main feedback route is the route of the load current feedback circuit 200 and the percentage of contribution of the voltage feedback is small. Therefore, the impedance at the output node 133 of the filter 130 which is the voltage feedback point lowers to deteriorate the open loop gain characteristic which is one of the factors that determine the self-oscillation frequency. If no proper measure is taken, the self-oscillation frequency becomes a frequency (e.g., 30 to 50 kHz) that is lower than the intended frequency (e.g., 200 to 500 kHz). In view of this, in the embodiment, the filter current feedback circuit 300 is provided in addition to the load current feedback circuit 200.

In the filter 130, a current flowing through the capacitor 132 which is parallel-connected to the speaker SP (load) is generated by high-frequency components (higher than the LC resonance frequency) of PWM pulses that are output from the output stage 120. By feeding back the current flowing through the capacitor 132 of the filter 130, the high-frequency open loop gain characteristic can be prevented from being deteriorated, whereby the self-oscillation frequency of the class-D amplifier 100 can be made equivalent to a frequency of a conventional self-oscillation amplifier that is not equipped with the load current feedback circuit 200.

Furthermore, unlike vacuum tube amplifiers, the power amplifier 1 according to the embodiment which employs semiconductor devices can be reduced in size and weight and is convenient to handle. In addition, unlike vacuum tube amplifiers, the power amplifier 1 according to the embodiment which employs the class-D amplifier 100 in which the loss is low in the output stage 120 can drive the speaker SP with high efficiency.

Still further, in the embodiment, since the input signal supplier 50 is provided, sound reproduction of a vacuum tube amplifier can be reproduced by the class-D amplifier by simulating an operation of the vacuum tube amplifier including a power source. This advantage will be described below.

Figure 6:
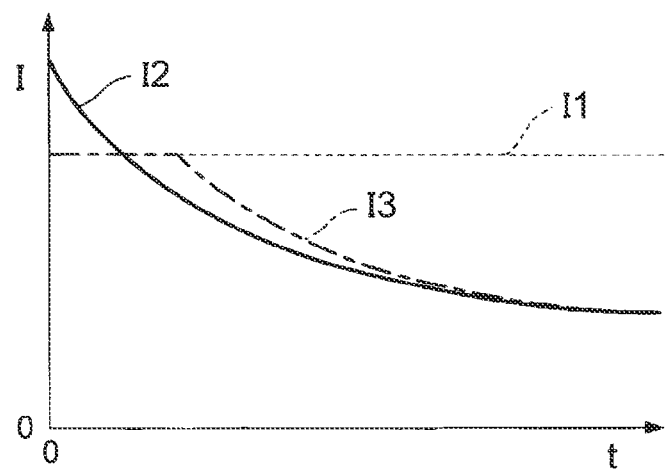
FIG. 6 compares an output current characteristic of the power amplifier according to the embodiment with output current characteristics of a vacuum tube amplifier and a referential example power amplifier.

FIG. 6 shows an output current characteristic I1 of a power amplifier that is obtained by removing the input signal supplier 50 from the power amplifier 1 according to the embodiment, an output current characteristic I2 of a vacuum tube amplifier, and an output current characteristic I3 of the power amplifier 1 according to the embodiment. In FIG. 6, the horizontal axis represents the time t and the vertical axis represents the load current that is supplied from the power amplifier. FIG. 6 shows the load currents I1, I2, and I3 that are supplied from the respective power amplifiers to the speaker (load) vary in time when the amplitude of an input signal AIN rises stepwise from 0 V at time t=0.

As illustrated in FIG. 6, in the power amplifier without the input signal supplier 50, after the amplitude of an input signal AIN rises stepwise at time t=0, a constant load current I1 corresponding to the amplitude of the input signal AIN continues to be supplied to the load.

Figure 7:
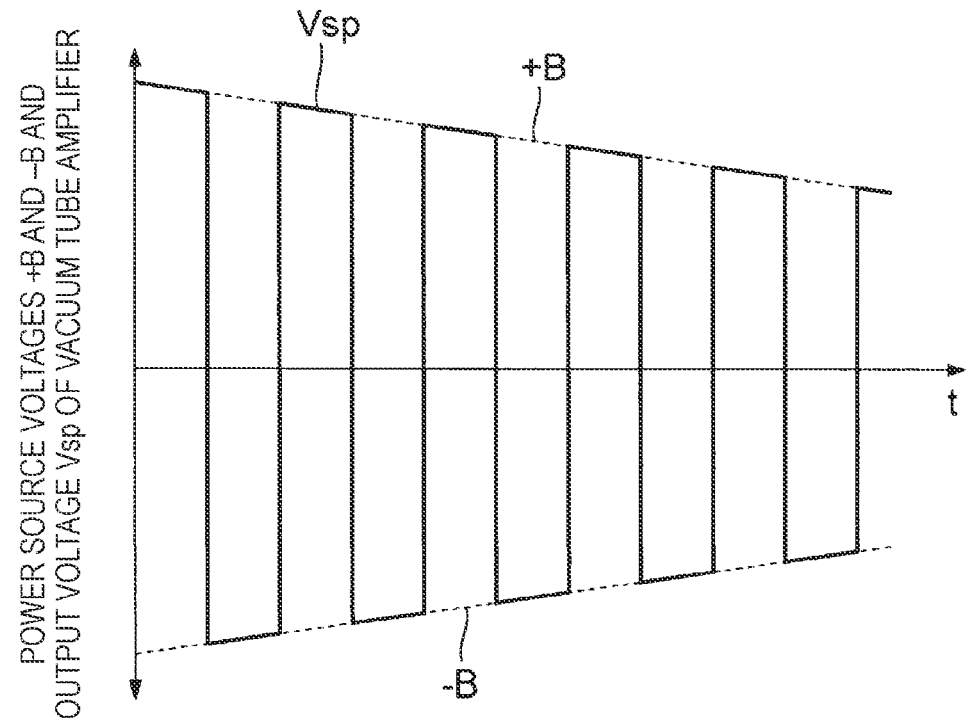
FIG. 7 is a waveform diagram showing example waveforms of power source voltages and an output signal of a vacuum tube amplifier.

On the other hand, the vacuum tube amplifier which is used as a guitar amplifier makes an operation that is close to a constant-current operation. The impedance of the speaker which is the load of the vacuum tube amplifier is high around the resonance frequency f0 of the speaker. Therefore, there may occur an event that the output signal of the vacuum tube amplifier is clipped at the level of a power source voltage that is applied to the vacuum tube amplifier. FIG. 7 shows such an example operation of the vacuum tube amplifier.

When the amplitude of an input signal AIN to the vacuum tube amplifier rises at time t=0 to so large a value that its output signal is clipped, the power source voltages +B and −B that are applied to the vacuum tube amplifier and its output signal Vsp vary as illustrated in FIG. 7. That is, after time t=0, the power source voltages +B and −B that are applied to the vacuum tube amplifier decrease gradually and the clip level of the output signal Vsp of the vacuum tube amplifier also decreases gradually.

As a result, in the vacuum tube amplifier, as illustrated in FIG. 6, after the amplitude of the input signal AIN rises at time t=0 to so large a value that its output signal is clipped, the load current I2 flowing through the load decreases slowly as time elapses. If the vacuum tube amplifier produces an output signal Vsp as illustrated in FIG. 7 in a frequency range around the resonance frequency f0 of the speaker, sound reproduction with a superior sense of sound pressure can be realized. This kind of characteristic of vacuum tube amplifiers is particularly important to guitarists.

The above phenomenon occurs due to the power source used for the vacuum tube amplifier. As indicated by FIG. 2, the power source for the vacuum tube amplifier incorporates a capacitor C. When the amplitude of the input signal AIN rises stepwise, the charge stored in the capacitor C is supplied to the load via the vacuum tube amplifier. Therefore, at an instant when the amplitude of the input signal AIN rises to so large a value that its output signal is clipped, a large current is supplied from the vacuum tube amplifier to the load. However, as the capacitor C is discharged thereafter, since the internal impedance of the power source is high, the output voltage of the power source for the vacuum tube amplifier and hence the load current supplied from the vacuum tube amplifier to the load decreases gradually. In this manner, the vacuum tube amplifier can provide a large instantaneous maximum power relative to a continuous maximum power and thus enables instantaneous emission of a large-volume sound.

In the power amplifier 1 according to the embodiment, the input signal supplier 50 simulates an operation of the virtual power source 56 illustrated in FIG. 2 and adjusts the amplitude of an input signal AIN' according to a virtual output voltage Vo(f) that occurs when the virtual power source 56 outputs a load current I(f). Therefore, as in the case of the vacuum tube amplifier, the load current 13 flowing through the load decreases slowly as time elapses after a stepwise rise of the amplitude of an input signal AIN.

On the other hand, in the embodiment, as in the ordinary class-D amplifier, the power sources +B and −B having a low internal impedance are connected to the output stage 120 of the class-D amplifier 100 and the output stage 120 outputs rectangular pulses whose H level and L level are +B and −B, respectively. And the input signal supplier 50 realizes an output current characteristic that is similar to the output current characteristic of the vacuum tube amplifier by adjusting the amplitude of an input signal AIN' to be given to the class-D amplifier 100. Thus, the embodiment can realize sound reproduction of the same level as obtained with the vacuum tube amplifier.

Other Embodiments

The one embodiment of the disclosure has been described above. Among other possible embodiments of the disclosure are the following:

(1) The power amplifier 1 may be configured in such a manner that information relating to the configuration of the virtual power source 56 illustrated in FIG. 2, such as L, R, and C values, is stored in a memory and the DSP 52 reads this information from the memory and calculates a coefficient $\alpha(f)$ on the basis of a load current V).

(2) The power amplifier 1 may be such that the arguments $\theta(fk)$ of the coefficients $\alpha(fk)$ are disregarded and the phase shifters 503_$k$ (k=1 to N) are omitted.

(3) In the above embodiment, a virtual output voltage Vo(f) that occurs when the virtual power source 56 outputs a load current I(f) is calculated on the basis of the information relating to the configuration of the virtual power source 56. Instead, the power amplifier 1 may be such that a table or the like indicating an output current versus output voltage characteristic showing a relationship between the output current I(f) and the output voltage Vo(f) of the virtual power source 56 is stored in a memory and the DSP 52 calculates a virtual output voltage Vo(f) on the basis of a load current I(f) and the information stored in the memory. In this case, to reduce the amount of table data and the amount of calculation of the DSP 52, the output current vs. output voltage characteristic may be defined using only the absolute values of the output current I(f) and the output voltage Vo(f), that is, disregarding their arguments.

(4) Although in the above embodiment only the load current flowing through the speaker SP is involved in the amplitude adjustment of an input signal AIN' to the class-D amplifier 100, the output voltage that is applied to the speaker SP may be involved, in addition to the load current, in the amplitude adjustment of the input signal AIN'.

(5) In a case that a power source to be simulated is one to be connected to a vacuum tube amplifier having an output transformer, the DSP 52 of the input signal supplier 50 may perform the following signal amplification processing. First, let the internal inductance, the internal resistance, and the internal capacitance of the power source circuit for the vacuum tube amplifier be represented by L, Rs, and C and let the number of turns of the primary side and that of the secondary side of the output transformer of the vacuum tube amplifier be denoted by n1 and n2. A current flowing through the primary winding of the output transformer becomes equal to (n2/n1)I, where I is the current that is supplied from the secondary winding of the output transformer to the speaker SP. The current (n2/n1)I is output from the power source to the vacuum tube amplifier.

A virtual power source is assumed that has an internal inductance Ld=L×(n2/n1)², an internal resistance Rsd=Rs×(n2/n1)², and an internal capacitance Cd=C×(n1/n2)². The DSP 52 performs signal amplification processing for adjusting the amplitude of an input signal AIN' to the class-D amplifier 100 according to a virtual output voltage of the virtual power source that occurs when this virtual power source outputs a current to flow through the speaker SP. The power amplifier 1 according to this embodiment makes it possible to reproduce sound reproduction as performed by the vacuum tube amplifier having the output transformer.

(6) Although in the above embodiment the amplitude of an input signal AIN' to the class-D amplifier 100 is adjusted on the basis of a load current flowing through the speaker SP, the amplitude adjustment of an input signal AIN' may be performed on the basis of an output voltage that is applied to the speaker SP.

Figure 8:
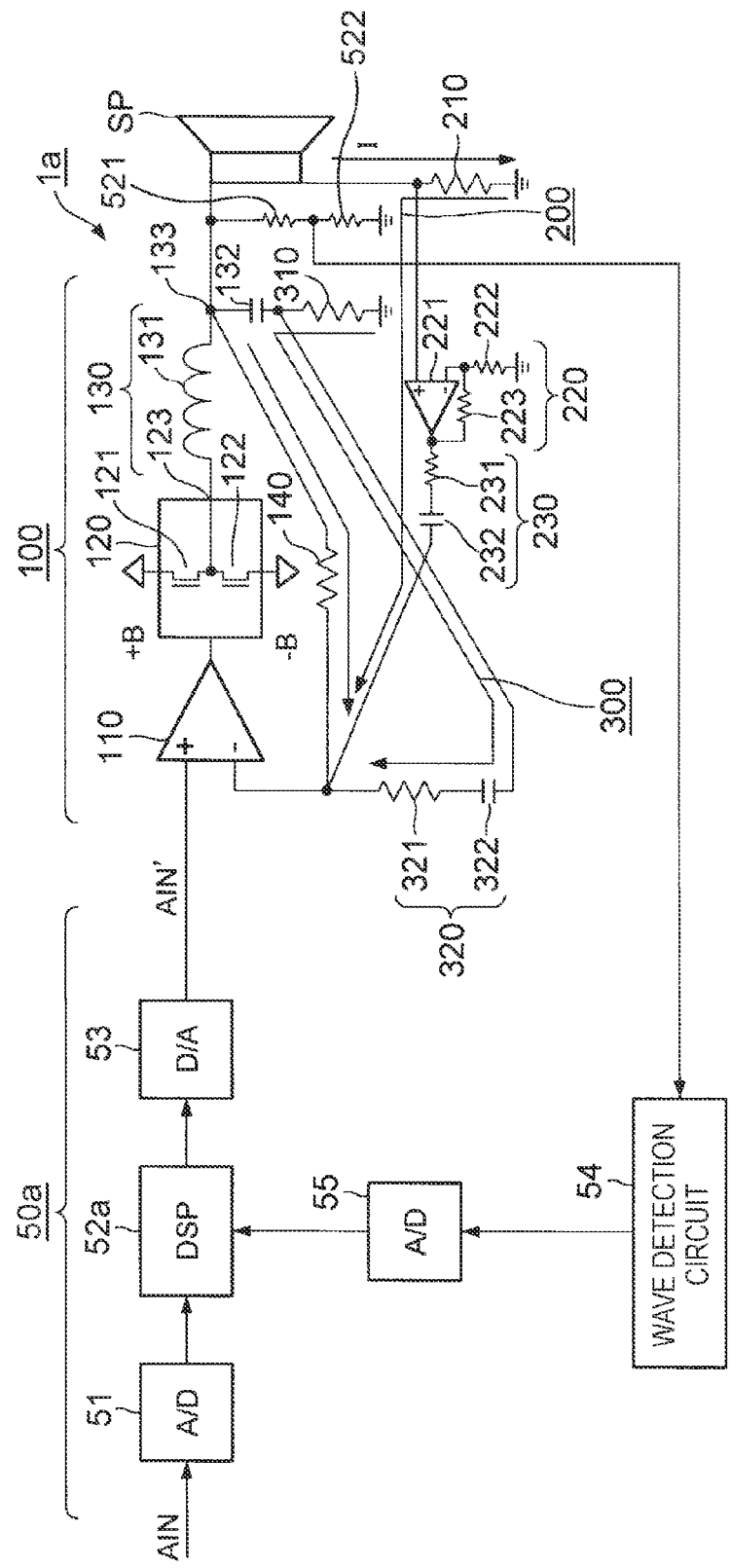
FIG. 8 is a circuit diagram showing the configuration of a power amplifier according to another embodiment of the disclosure.

FIG. 8 is a circuit diagram showing the configuration of a power amplifier 1*a* in which the amplitude adjustment of an input signal AIN' is performed on the basis of an output voltage that is applied to the speaker SP. The power amplifier 1*a* is configured in such a manner that resistors 521 and 522 are added to the power amplifier 1 according to the above embodiment and the input signal supplier 50 of the power amplifier 1 is replaced by an input signal supplier 50*a*. In the input signal supplier 50*a*, the DSP 52 of the input signal supplier 50 is replaced by a DSP 52*a*.

As illustrated in FIG. 8, an output voltage that is applied to the speaker SP is also applied to a voltage division circuit having the resistors 521 and 522. An output voltage of the voltage division circuit having the resistors 521 and 522 is detected by the wave detection circuit 54 and converted by the A/D converter 55 into a digital signal, which is supplied to the DSP 52*a*. The DSP 52*a* calculates a load current I flowing through the speaker SP on the basis of the output voltage applied to the speaker SP that is indicated by the output signal of the A/D converter 55 and an impedance characteristic of the speaker SP that is stored in advance. The impedance characteristic of the speaker SP that is given to the DSP 52*a* may be either one that is obtained by a measurement on the speaker SP at the time of activation of the power amplifier 1*a* or one obtained by a measurement at the time of shipment from a factory.

Like the DSP 52 used in the above embodiment, the DSP 52*a* calculates a virtual output voltage Vo of the virtual power source 56 that occurs when the virtual power source outputs the load current I, adjusts the amplitude of an output signal of the A/D converter 51 using a coefficient α that is determined by the virtual output voltage Vo, and supplies an amplitude-adjusted input signal AIN'=αAIN to the class-D amplifier 100. This embodiment provides the same advantages as the above embodiment does.

The features of the above-described power amplifier and an input signal adjusting method according to the embodiments of the disclosure will be summarized below as respective items [1]-[12].

[1] The present disclosure provides a power amplifier comprising:
a class-D amplifier that comprises an input portion and a switching device, wherein the switching device is switched in accordance with an input signal that is input to the input portion so that a current is supplied to a load from a power source via the switching device; and
an input signal supplier configured to supply the input signal to the input portion of the class-D amplifier, to calculate a virtual output voltage to be output from a virtual power source having a prescribed internal impedance characteristic when a current to flow through the load is output from the virtual power source, and to adjust an amplitude of the input signal in accordance with the virtual output voltage.

[2] In the power amplifier according to the item [1], the input signal supplier comprises a signal processing circuit which performs a signal amplification processing based on an internal impedance characteristic of a virtual power source that is a simulation of a power source for a vacuum tube amplifier to adjust the amplitude of the input signal.

[3] In the power amplifier according to the item [2], the signal processing circuit performs a signal amplification processing based on the virtual power source that is a simulation of a power source circuit for the vacuum tube amplifier having an internal inductance Ld=L×(n2/n1)², an internal resistance Rsd=Rs×(n2/n1)², and an internal capacitance Cd=C×(n1/n2)², where L, Rs, and C are the internal inductance, internal resistance, and internal capacitance of the power source circuit for the vacuum tube amplifier, respectively, and n1 and n2 are the number of turns of the primary side and that of the secondary side of an output transformer of the vacuum tube amplifier.

[4] In the power amplifier according to any one of the items [1] to [3], the input signal supplier calculates the virtual output voltage of the virtual power source from the current to flow through the load based on information indicating a configuration of an equivalent circuit of the virtual power source.

Also, for example, the input signal supplier adjusts the amplitude of the input signal based on a coefficient that is determined by the calculated virtual output voltage of the virtual power source.

[5] In the power amplifier according to any one of the items [1] to [3], the input signal supplier calculates the virtual output voltage of the virtual power source based on the current to flow through the load according to an output current versus output voltage characteristic of the virtual power source.

[6] In the power amplifier according to any one of the items [1] to [5], further comprising:
a load current feedback circuit configured to negatively feed back the current flowing through the load to the input portion of the class-D amplifier.

[7] The present disclosure provides an input signal adjusting method for adjusting an input signal which is input to an input portion of a class-D amplifier, the class-D amplifier comprising the input portion and a switching device, wherein the switching device is switched in accordance with the input signal so that a current is supplied to a load from a power source via the switching device, the input signal adjusting method comprising:
calculating a virtual output voltage to be output from a virtual power source having a prescribed internal impedance characteristic when a current to flow through the load is output from the virtual power source; and
adjusting an amplitude of the input signal in accordance with the virtual output voltage.

[8] In the input signal adjusting method according to the item [7], in the calculating of the virtual output voltage, the virtual output voltage of the virtual power source is calculated based on an internal impedance characteristic of a virtual power source that is a simulation of a power source for a vacuum tube amplifier.

[9] In the input signal adjusting method according to the item [8], in the calculating of the virtual output voltage, the virtual output voltage of the virtual power source is calculated based on the virtual power source including an internal inductance $Ld=L\times(n2/n1)^2$, an internal resistance $Rsd=Rs\times(n2/n1)^2$, and an internal capacitance $Cd=C\times(n1/n2)^2$, where L, Rs, and C are the internal inductance, internal resistance, and internal capacitance of a power source circuit for a vacuum tube amplifier, respectively, and n1 and n2 are the number of turns of the primary side and that of the secondary side of an output transformer of the vacuum tube amplifier.

[10] In the input signal adjusting method according to any one of the items [7] to [9], in the calculating of the virtual output voltage, the virtual output voltage of the virtual power source is calculated from the current to flow through the load based on information indicating a configuration of an equivalent circuit of the virtual power source.

[11] In the input signal adjusting method according to any one of the items [7] to [9], in the calculating of the virtual output voltage, the virtual output voltage of the virtual power source is calculated based on the current to flow through the load according to an output current versus output voltage characteristic of the virtual power source.

[12] In the input signal adjusting method according to any one of the items [7] to [11], further comprising:
negatively feeding back the current flowing through the load to the input portion of the class-D amplifier.

What is claimed is:

1. A power amplifier comprising:
a class-D amplifier that comprises an input portion and a switching device, wherein the switching device is switched in accordance with an input signal that is input to the input portion so that a current is supplied to a load from a power source via the switching device; and
an input signal supplier configured to supply the input signal to the input portion of the class-D amplifier, to calculate a virtual output voltage to be output from a virtual power source having a prescribed internal impedance characteristic when a current to flow through the load is output from the virtual power source, and to adjust an amplitude of the input signal in accordance with the virtual output voltage.

2. The power amplifier according to claim 1, wherein the input signal supplier comprises a signal processing circuit which performs a signal amplification processing based on an internal impedance characteristic of a virtual power source that is a simulation of a power source for a vacuum tube amplifier to adjust the amplitude of the input signal.

3. The power amplifier according to claim 2, wherein the signal processing circuit performs a signal amplification processing based on the virtual power source that is a simulation of a power source circuit for the vacuum tube amplifier having an internal inductance $Ld=L\times(n2/n1)^2$, an internal resistance $Rsd=Rs\times(n2/n1)^2$, and an internal capacitance $Cd=C\times(n1/n2)^2$, where L, Rs, and C are the internal inductance, internal resistance, and internal capacitance of the power source circuit for the vacuum tube amplifier, respectively, and n1 and n2 are the number of turns of the primary side and that of the secondary side of an output transformer of the vacuum tube amplifier.

4. The power amplifier according to claim 1, wherein the input signal supplier calculates the virtual output voltage of the virtual power source from the current to flow through the load based on information indicating a configuration of an equivalent circuit of the virtual power source.

5. The power amplifier according to claim 1, wherein the input signal supplier calculates the virtual output voltage of the virtual power source based on the current to flow through the load according to an output current versus output voltage characteristic of the virtual power source.

6. The power amplifier according to claim 1, further comprising:
a load current feedback circuit configured to negatively feed back the current flowing through the load to the input portion of the class-D amplifier.

7. An input signal adjusting method for adjusting an input signal which is input to an input portion of a class-D amplifier, the class-D amplifier comprising the input portion and a switching device, wherein the switching device is switched in accordance with the input signal so that a current is supplied to a load from a power source via the switching device, the input signal adjusting method comprising:
calculating a virtual output voltage to be output from a virtual power source having a prescribed internal impedance characteristic when a current to flow through the load is output from the virtual power source; and
adjusting an amplitude of the input signal in accordance with the virtual output voltage.

8. The input signal adjusting method according to claim 7, wherein in the calculating of the virtual output voltage, the virtual output voltage of the virtual power source is calculated based on an internal impedance characteristic of a virtual power source that is a simulation of a power source for a vacuum tube amplifier.

9. The input signal adjusting method according to claim 8, wherein in the calculating of the virtual output voltage, the virtual output voltage of the virtual power source is calculated based on the virtual power source including an internal inductance $Ld=L\times(n2/n1)^2$, an internal resistance $Rsd=Rs\times(n2/n1)^2$, and an internal capacitance $Cd=C\times(n1/n2)^2$, where L, Rs, and C are the internal inductance, internal resistance, and internal capacitance of a power source circuit for a vacuum tube amplifier, respectively, and n1 and n2 are the number of turns of the primary side and that of the secondary side of an output transformer of the vacuum tube amplifier.

10. The input signal adjusting method according to claim 7, wherein in the calculating of the virtual output voltage, the virtual output voltage of the virtual power source is calculated from the current to flow through the load based on information indicating a configuration of an equivalent circuit of the virtual power source.

11. The input signal adjusting method according to claim 7, wherein in the calculating of the virtual output voltage, the virtual output voltage of the virtual power source is calculated based on the current to flow through the load according to an output current versus output voltage characteristic of the virtual power source.

12. The input signal adjusting method according to claim 7, further comprising:
negatively feeding back the current flowing through the load to the input portion of the class-D amplifier.

* * * * *